(12) United States Patent
Łuczak et al.

(10) Patent No.: US 12,745,359 B2
(45) Date of Patent: Sep. 22, 2026

(54) MODULAR DEVICE ENABLING FLEXIBLE EXPANSION OF THE FUNCTIONS OF MONITORING, CONFIGURING, REGULATING, MEASURING AND ARCHIVING PARAMETERS OF THE GAS AND LIQUID MEDIA TRANSMISSION PROCESS FOR CALCULATORS/CONVERTORS

(71) Applicant: INTEGROTECH SP. Z O.O., Łódź (PL)

(72) Inventors: Piotr Łuczak, Łódź (PL); Grzegorz Niklewicz, Bibice (PL); Paweł Roksela, Stryków (PL); Artur Witek, Łódź (PL); Rafał Zagawa, Łódź (PL)

(73) Assignee: INTEGROTECH SP. Z.O.O., Lodz (PL)

( * ) Notice: Subject to any disclaimer, the term of this patent is extended or adjusted under 35 U.S.C. 154(b) by 101 days.

(21) Appl. No.: 18/740,282

(22) Filed: Jun. 11, 2024

(65) Prior Publication Data

US 2025/0008675 A1 Jan. 2, 2025

(30) Foreign Application Priority Data

Jun. 29, 2023 (PL) ..................................... P.445416

(51) Int. Cl.
*H05K 5/02* (2006.01)
*H05K 7/20* (2006.01)

(52) U.S. Cl.
CPC ............ *H05K 5/0256* (2013.01); *H05K 7/20* (2013.01)

(58) Field of Classification Search
CPC .... H05K 5/0256; H05K 7/20563; H05K 7/20; G01F 15/06
See application file for complete search history.

(56) References Cited

U.S. PATENT DOCUMENTS

| | | | | |
|---|---|---|---|---|
| 9,888,609 B2 * | 2/2018 | Turgeon | .................. | H01L 23/34 |
| 2012/0044630 A1 * | 2/2012 | Elwany | ................ | G06F 1/1601 29/592.1 |

(Continued)

OTHER PUBLICATIONS

Operating Instructions for the Control Unit of Pressure and Flow Regulation Systems MSPR-4.0-PQReg ver.1.5, 2.0: EMRP-1.0 for LC-EiT-10 (Year: 2025).*

(Continued)

*Primary Examiner* — Allen L Parker
*Assistant Examiner* — Peter Krim
(74) *Attorney, Agent, or Firm* — Myers Wolin, LLC

(57) ABSTRACT

A modular device enabling flexible expansion of the monitoring, configuration, regulation, measurement and archiving functions of gas and liquid media transfer process parameters for flow calculators/computers—MSPR-4.0-PO. The device comprises five boards with electronic components (1, 2, 3, 4, 5), while the first board (1), a hybrid management unit, features a seven-inch resistive touch screen LCD panel (6), a single-module SOM-type computer (7) with a dedicated heatsink (8) to passively dissipate heat from the single-module SOM-type computer (7), four RS232/422/485 communication ports (9), four Ethernet ports (10), two USB ports (11), an internal power supply port (12), an internal power and communication port (13), a port for an external memory card (14), connectors for a battery (15) for maintaining memory time and device time.

1 Claim, 8 Drawing Sheets

(56) References Cited

U.S. PATENT DOCUMENTS

| | | | | |
|---|---|---|---|---|
| 2012/0224312 | A1* | 9/2012 | Shreve | H05K 7/1485 361/679.02 |
| 2015/0355690 | A1* | 12/2015 | Baba | H05K 7/1445 361/692 |
| 2016/0146653 | A1* | 5/2016 | Skelding | E21B 21/01 73/861.01 |
| 2020/0232729 | A1* | 7/2020 | Schneider | F28G 15/04 |
| 2023/0386467 | A1* | 11/2023 | Saxena | G10L 15/30 |

OTHER PUBLICATIONS

Integrotech/Emerpol, "Operating Manual for the Control Unit of Pressure and Flow Regulation Systems—MSPR-4.0-PQReg", version: EMRP-1.0 for LC-EiT-10, Mar. 28, 2022, with English translation of title page attached.

Plum Gas, MacBAT 5—gas volume and energy corrector—Electronic volume Converter User Guide—Data Structure Program Version: 1603 Program Series: 005.xx Hardware Version: Document Edition 7.2, Jun. 2018, PLUM Electronics.

Search Report issued by the Patent Office of Poland for Polish Patent Application No. P445416, dated Mar. 21, 2024, with English translation attached.

* cited by examiner

MODULAR DEVICE ENABLING FLEXIBLE EXPANSION OF THE FUNCTIONS OF MONITORING, CONFIGURING, REGULATING, MEASURING AND ARCHIVING PARAMETERS OF THE GAS AND LIQUID MEDIA TRANSMISSION PROCESS FOR CALCULATORS/CONVERTORS

CROSS REFERENCE TO RELATED APPLICATIONS

The present patent application is a U.S. national application filed under 35 U.S.C. 111(a), which claims priority to Polish Application P. 445416, filed on Jun. 29, 2023, the content of which is incorporated in this patent application by reference in its entirety for all purposes.

FIELD OF THE INVENTION

The invention relates to a modular device enabling flexible expansion of the monitoring, configuration, regulation, measurement and archiving functions of gas and liquid media transfer process parameters for flow calculators/computers, MSPR-4.0-PO (Operator Panel). The device aggregates all measurement data with the possibility of local and remote operation, making the aggregated data available to several master systems at the same time via the industry protocols GazModem I, II, III, Modbus, as well as Bluetooth. The device has the functional features of an HMI, expanded with dedicate measuring signal input-output card modules and a battery power supply system, acts as a HUB for other modules and a central unit for the facility user. It is equipped with its own operating system and a non-volatile memory allowing to store replicas of the databases of the other modules of the system.

BACKGROUND

The known devices available on the market allow the functionality of flow computers to be extended only by connecting separate expansion modules mounted outside the device. An example of such a solution are the input-output (I/O) expansion modules of the MacMat 5 device from the Polish company PLUM, built in the form of an enclosed casing with the possibility of connecting external modules mounted on a DIN rail near the flow computer. This solution does not allow for flexible expansion of inputs-outputs, but only for attaching additional, separate devices working independently, with the need to connect power supply and communication to each module separately, thus making non-invasive installation on existing facilities impossible.

SUMMARY

The modular device enabling flexible expansion of the monitoring, configuration, regulation, measurement and archiving functions of gas and liquid media transfer process parameters for flow calculators/computers according to the invention comprises five boards with electronic components. The first board, a hybrid management unit, features a seven-inch resistive touch screen LCD panel, a single-module SOM-type computer with a dedicated heatsink to passively dissipate heat from the single-module SOM-type computer, four RS232/422/485 communication ports, four Ethernet ports, two USB ports, an internal power supply port, an internal power and communication port, a port for an external memory card, connectors for a battery for maintaining memory time and device time. On the second board, two RJ45 ports are mounted, a front one and a pass-through one. On the third board two USB ports are mounted, a front and a pass-through one and on the fourth board six RJ45 ports are mounted, a rear and a pass-through one. On the fifth board are fitted the ports used for power supply, the ports used for data transmission, the power outlet for flow calculators/computers. The whole is housed in a five-piece enclosure with two specially prepared dedicated mounting spaces for two flow calculators/computers and a bay allowing flexible expansion of the I/O modules from a wide range of available custom solutions. The enclosure has internal fans and a reinforced front panel on which a front enclosure section is mounted that also acts as a keyboard for the device. In addition, the bottom and top covers of the enclosure have ventilation holes. On the rear side of the enclosure there are four RS232/422/485 communication port outlets, a 230V power connection, a 24V port, three RJ45 ports and two power outlets for two pieces of flow calculators/computers. A 230V/36V switch-mode power supply module for 230V/36V conversion is mounted inside the enclosure.

The design of the modular device enabling flexible expansion of the monitoring, configuration, regulation, measurement and archiving functions of gas and liquid media transfer process parameters for flow calculators/computers allows it to be used as a mounting shelf for flow calculators/computers, so that it is not required to be mounted as a separate expansion module. The user has the option of dismantling the flow calculator/computer already owned and installing a new device in its place. The flow calculators/computers is then inserted into the space prepared for it in the device's enclosure. In addition, it is not necessary to connect a separate power supply sources for each module. The power supply is connected to the MSPR-4.0-PO, and then from the dedicated power outputs on the back of the enclosure, the power supply for the flow calculators/computers is connected. The final step is to connect the communication from the flow calculators/computers to the MSPR-4.0-PO (Operator Panel) at the user's option, via RS485 or Ethernet.

Expansion modules and the battery power supply system are also mounted inside the MSPR-4.0-PO, in an installer-friendly and end-user-friendly manner. Adding new cards to the device does not require disassembly of its enclosure, nor the presence of a service technician. Nor is any reworking of the on-site electrical and communications systems required. The modules slide directly into the expansion module bay available on the rear of the enclosure. Guides are fitted in the bay to guide the module into the dedicated communication and power port. Any possible replacement simply involves sliding out the selected module and inserting the new one.

The modular device according to the invention allows additional signal inputs/outputs and battery backup to be added to an existing device on customer installations in a modular and easy-to-mount manner. It makes it possible for the users to flexibly adapt the device to their needs, regardless of the number of inputs available.

BRIEF DESCRIPTION OF THE DRAWING

The modular device enabling flexible expansion of the monitoring, configuration, regulation, measurement and archiving functions of gas and liquid media transfer process parameters for flow calculators/computers is shown in the embodiment and the drawing in which.

DETAILED DESCRIPTION OF THE PREFERRED EMBODIMENTS

Figure 1:
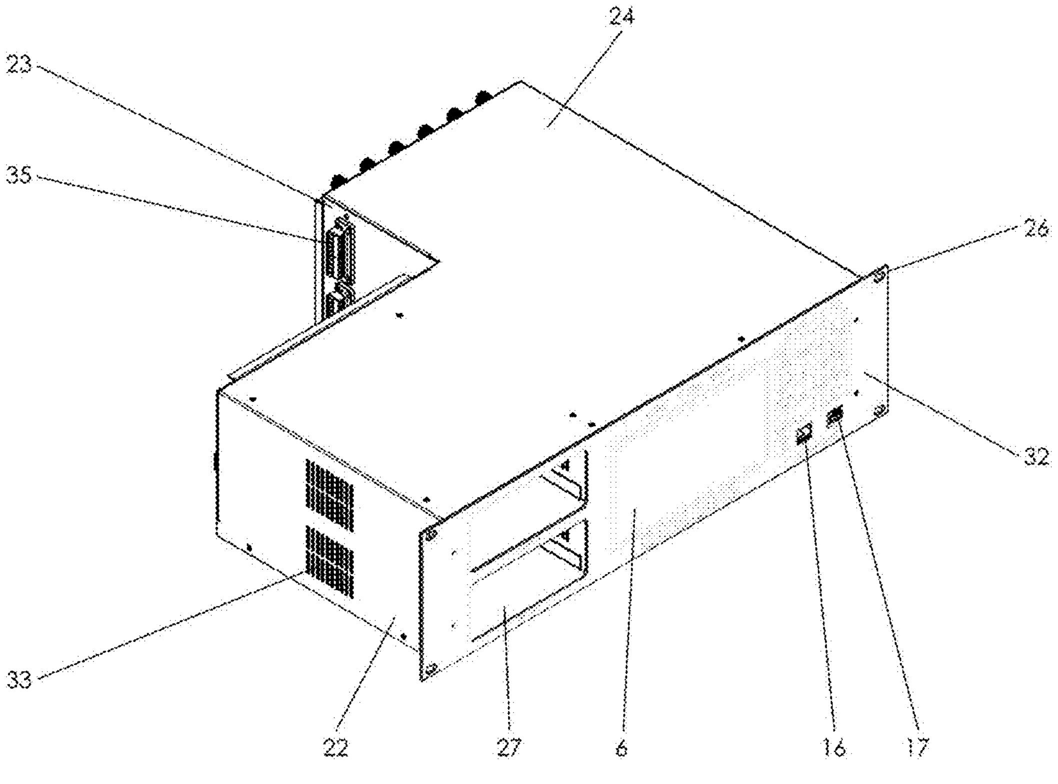
FIG. 1 and FIG. 2 show the device in front and rear perspective view.
Figure 2:
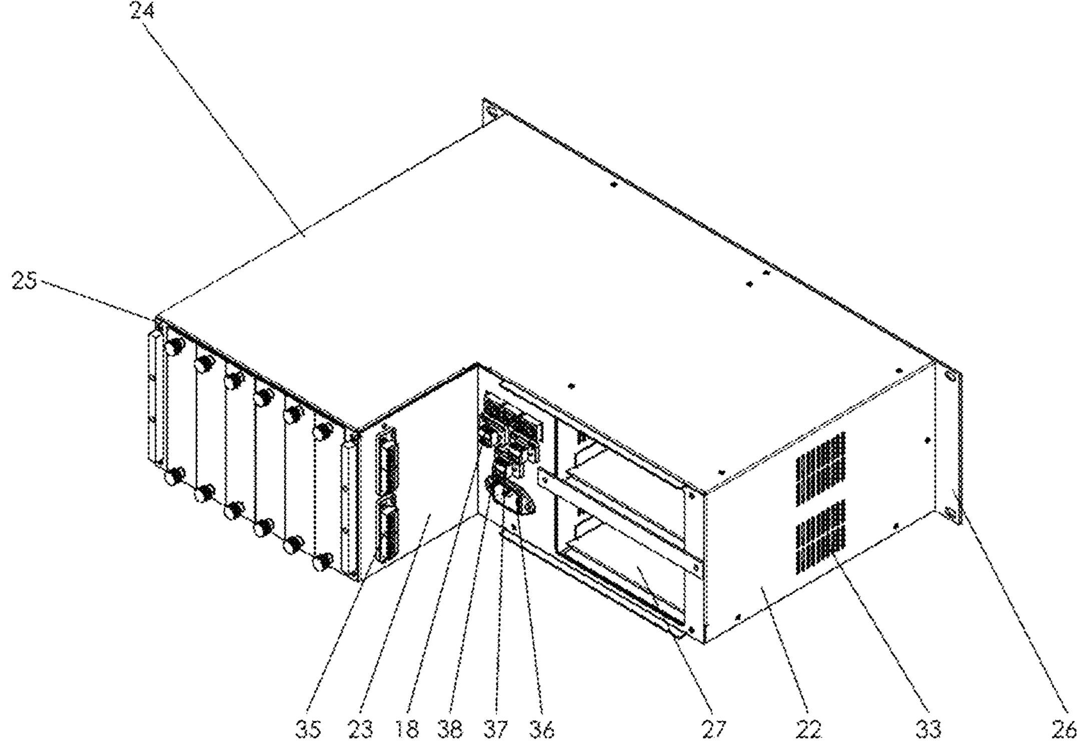
Figure 3:
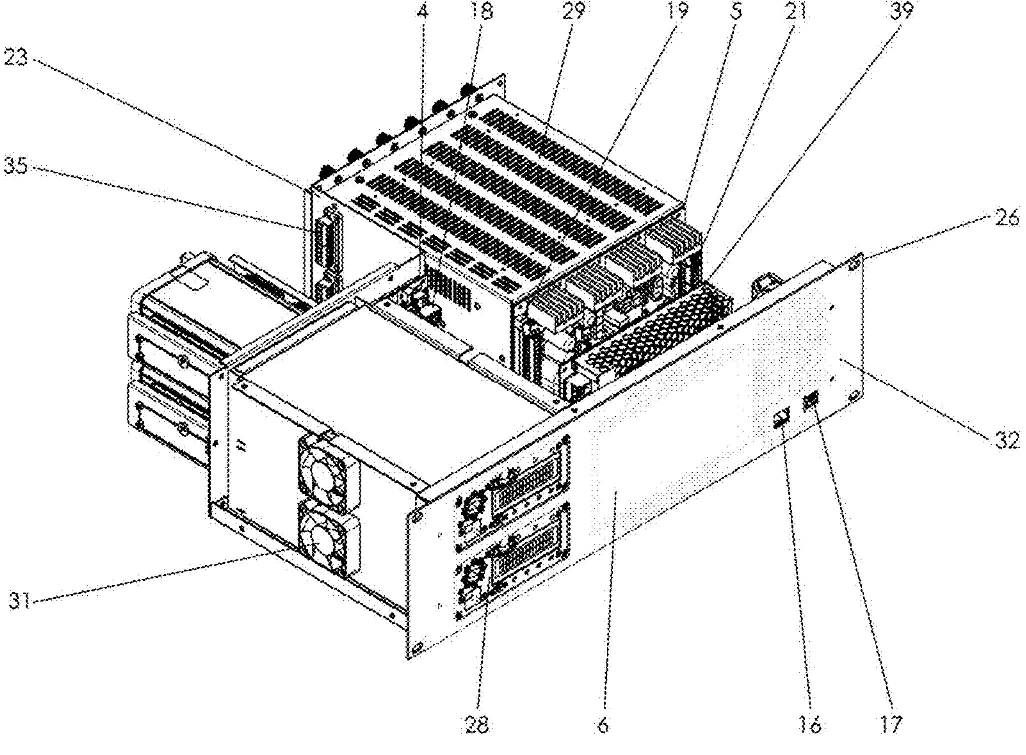
FIG. 3 and FIG. 4 show the device in front and rear perspective view with mounted flow calculators/computers without top cover.
Figure 4:
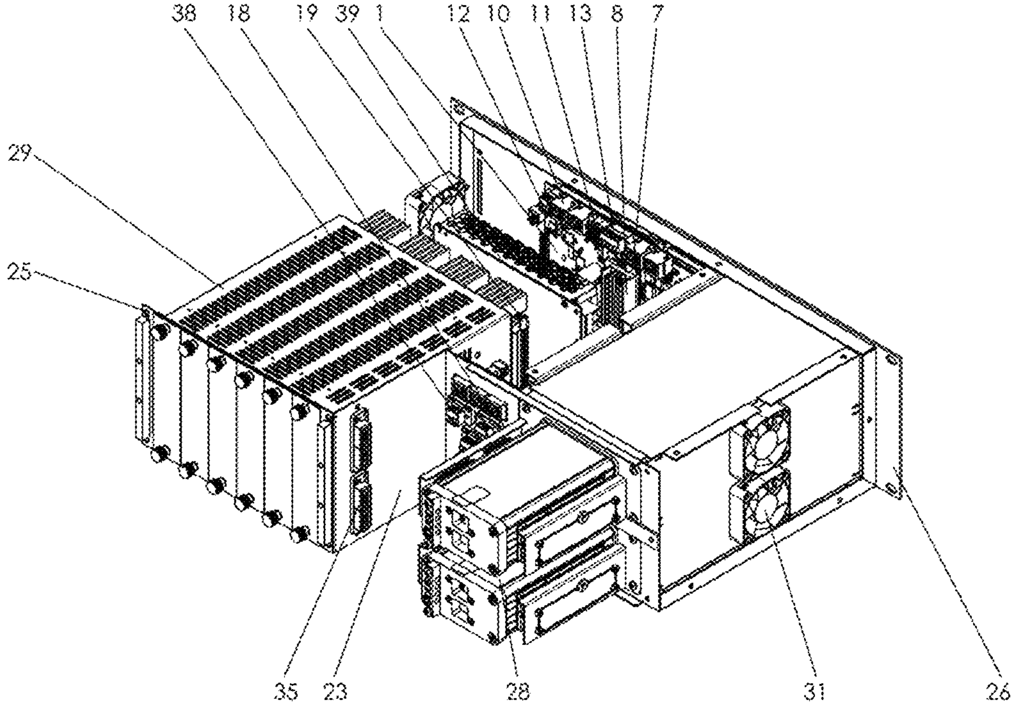
Figure 5:
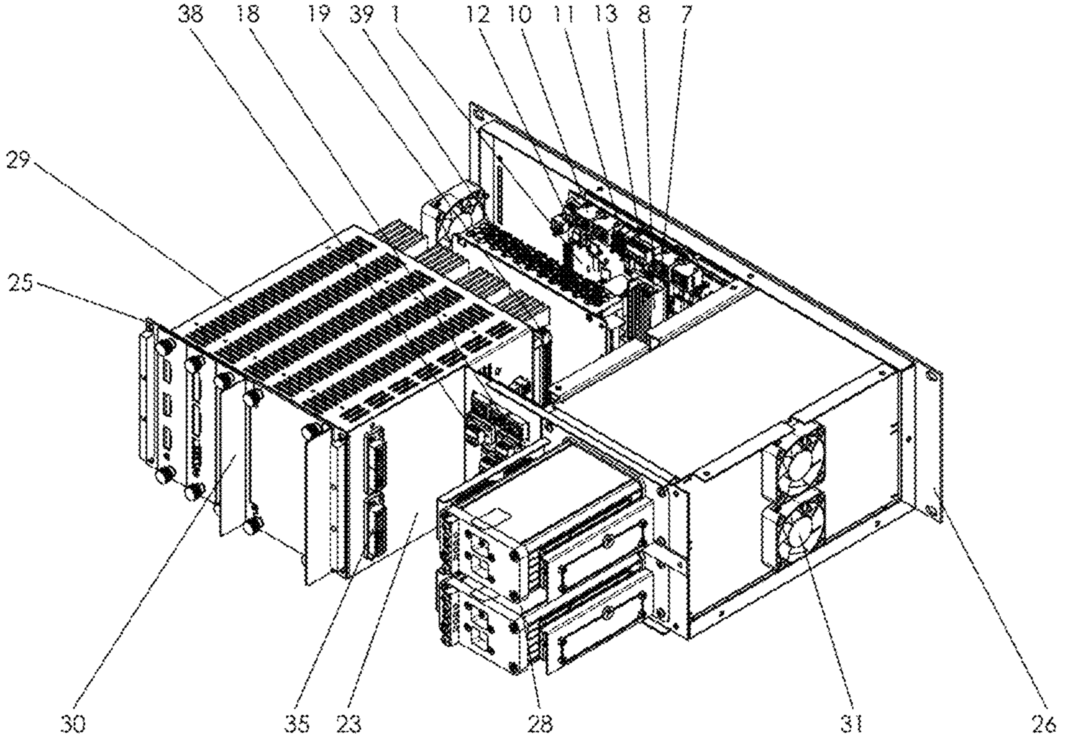
FIG. 5 shows the device in perspective view from the rear with mounted flow calculators/computers and expansion modules—all six slots occupied.
Figure 6:
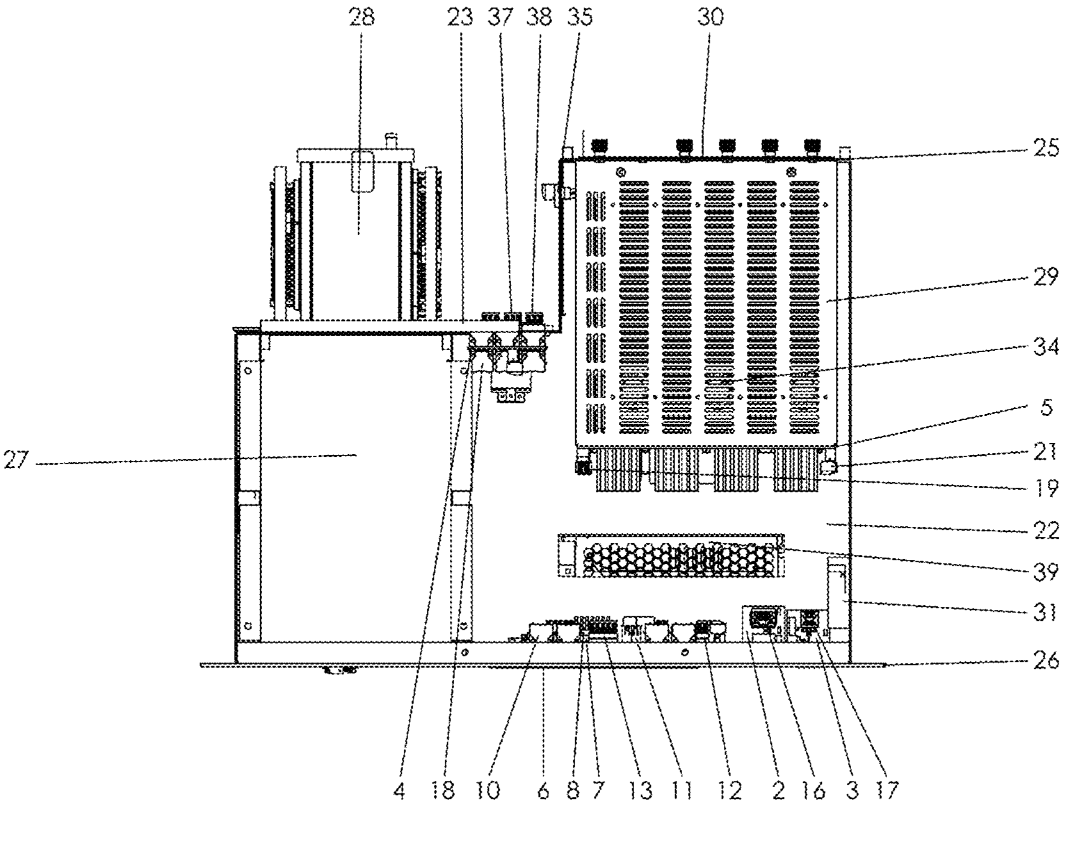
FIG. 6 shows a cross-section at the height of the top cover of the device in top view with mounted flow calculators/computers and expansion modules—all six slots occupied, FIG. 7—cross-sectional view of the hybrid management unit, FIG. 8—cross-sectional view of the control and power module for expansion modules.
Figure 7:
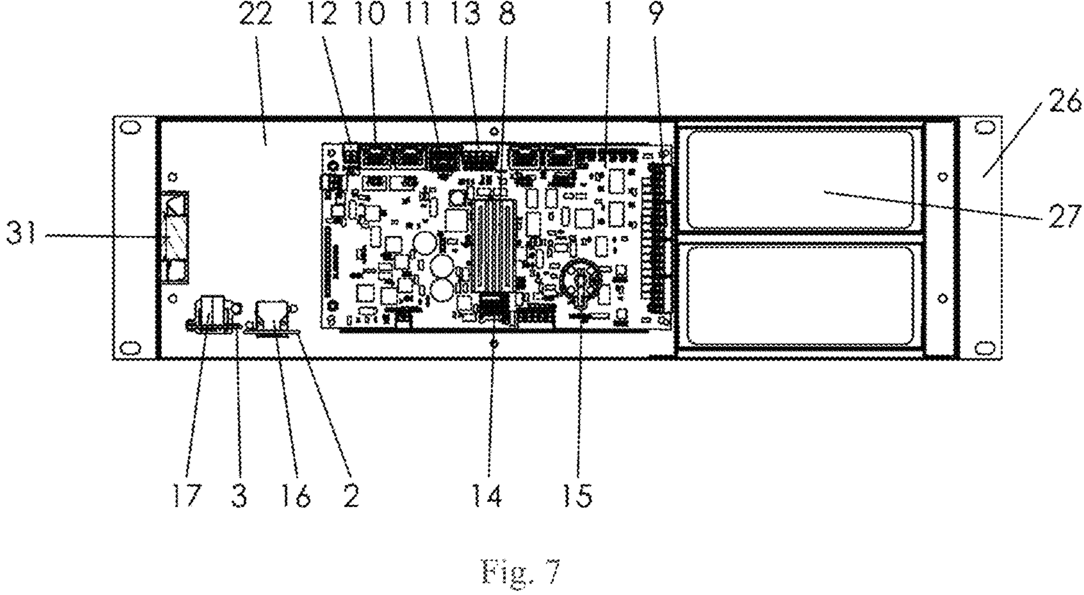
Figure 8:
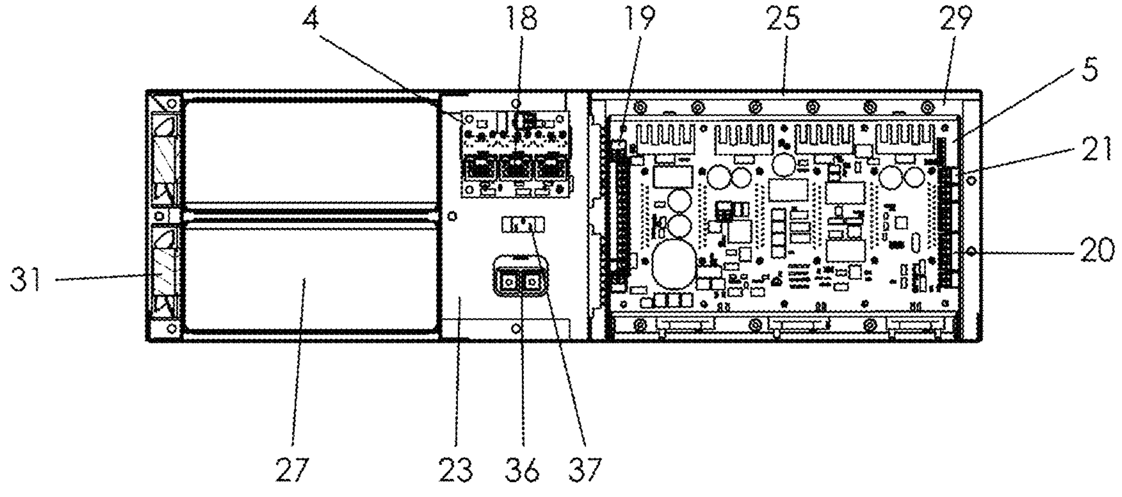

The device comprises five boards fitted with electronic components 1, 2, 3, 4, 5. The first board 1, a hybrid management unit, featuring a seven-inch resistive touch screen LCD panel 6, a single-module SOM-type computer 7 with a dedicated heatsink 8 to passively dissipate heat from the single-module SOM-type, 4 RS232/422/485 communication ports 9, four Ethernet ports 10, two USB ports 11, an internal power supply port 12, an internal power and communication port 13, a port for an external memory card 14, connectors for a battery 15 used for maintaining memory time and device time. On the second board 2, two RJ45 ports 16 are mounted, a front one and a pass-through one. On the third board 3 two USB ports 17 are mounted, a front and a pass-through one. On the fourth board 4 six RJ45 ports 18 are mounted, a rear and a pass-through one. On the fifth board 5 are fitted the ports used for power supply 19, the ports used for data transmission 20, the power outlet for flow calculators/computers 21.

The whole is housed in a five-piece enclosure 22, 23, 24, 25, 26 with two specially prepared dedicated mounting spaces 27 for two flow calculators/computers 28 and a bay 29 allowing flexible expansion of the I/O modules 30 from a wide range of available custom solutions. The enclosure has internal fans 31 and a reinforced front panel 26 on which a front enclosure section 32 is mounted that also acts as a keyboard for the device. In addition, the bottom and top covers of the enclosure have ventilation holes 33, 34. On the rear side of the enclosure 23 there are four RS232/422/485 communication port outlets 35, a 230V power connection 36, a 24V port 37, three RJ45 ports 18 and two power outlets for two pieces of flow calculators/computers 38. For 230V/36V voltage conversion, a 230V/36V 39 switch-mode power supply module is mounted inside the enclosure.

The invention claimed is:

1. A modular device enabling flexible expansion of a monitoring, configuration, regulation, measurement and archiving functions of gas and liquid media transfer process parameters for flow calculators/computers, the modular device comprising:

five boards with electronic components), wherein a first board of the five boards, a hybrid management unit, features a seven-inch resistive touch screen LCD panel, a single-module SOM-type computer with a dedicated heatsink to passively dissipate heat from the single-module SOM-type computer, four of any RS232/422/485 communication ports, four Ethernet ports, two USB ports, an internal power supply port, an internal power and communication port, a port for an external memory card, connectors for a battery for maintaining memory time and device time a second board of the five boards, where two RJ45 ports are mounted, for pass-through RJ45 connectors, a third board of the five boards where two USB ports are mounted, a fourth board of the five boards where six RJ45 ports are mounted, a fifth board, comprising ports, the ports used for a power supply, data transmission, and for power supply for flow calculators/computers, wherein the five boards are housed in a five-piece enclosure with two dedicated mounting spaces for two flow calculators/computers and a bay allowing flexible expansion of I/O modules and furthermore the five-piece enclosure has internal fans and a reinforced front panel on which a front enclosure section is mounted on which a keyboard for the device may be fitted, and in addition, bottom and top covers of the five-piece enclosure have ventilation holes, and on a rear side of the five-speed enclosure there are four of any RS232/422/485 communication port outlets, a 230V power connection, a 24V port, three RJ45 ports and two power outlets for two pieces of flow calculators/computers, and a 230V/36V switch-mode power supply module for 230V/36V conversion is mounted inside the five piece enclosure.

* * * * *